US006452176B1

United States Patent
Davis

(10) Patent No.: US 6,452,176 B1
(45) Date of Patent: *Sep. 17, 2002

(54) ARRANGEMENT AND METHOD FOR USING ELECTRON CHANNELING PATTERNS TO DETECT SUBSTRATE DAMAGE

(75) Inventor: Brennan V. Davis, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/359,103

(22) Filed: Jul. 22, 1999

(51) Int. Cl.[7] ................................................ H01J 37/30
(52) U.S. Cl. ..................................................... 250/310
(58) Field of Search ............................. 250/492.2, 309, 250/307, 310, 306

(56) References Cited

U.S. PATENT DOCUMENTS

| | | | |
|---|---|---|---|
| 5,191,213 A | * 3/1993 | Ahmed et al. ............... 250/310 |
| 5,424,254 A | 6/1995 | Damiot ......................... 438/15 |
| 5,525,806 A | * 6/1996 | Iwasaki et al. ......... 250/492.21 |
| 5,698,474 A | 12/1997 | Hurley ......................... 438/15 |
| 5,700,697 A | 12/1997 | Dlugokecki .................. 438/15 |
| 5,821,549 A | * 10/1998 | Talbot et al. ................ 250/307 |
| 5,930,588 A | 7/1999 | Paniccia ....................... 438/15 |
| 5,963,781 A | 10/1999 | Winer .......................... 438/14 |
| 5,972,725 A | 10/1999 | Wollesen et al. ............. 438/14 |
| 6,093,331 A | * 7/2000 | Wollesen |
| 6,281,025 B1 | * 8/2001 | Ring et al. ..................... 438/10 |

OTHER PUBLICATIONS

Joy, D.C., "SEM Microcharacterization of Semiconductors", Dec. 11, 1990, pp. 71–72, 75, 81, 83, 93, 100, 112–114.

"Phase ID–Microphase Identification for SEMs", Noran Instruments, 1998, pp. 1–4.

\* cited by examiner

Primary Examiner—Kiet T. Nguyen

(57) ABSTRACT

According to one aspect of the disclosure, a method for detecting a degree of substrate damage in an integrated circuit die is provided. In one example embodiment, the back side of the die is thinned and an examination region is exposed. An electron beam is used to scan the region, and backscattered electrons are detected in response. The detected backscattered electrons are used to provide an electron channeling pattern for the scanned region. The electron channeling pattern is then compared to a reference pattern and used to determine a degree of substrate damage.

20 Claims, 3 Drawing Sheets

ARRANGEMENT AND METHOD FOR USING ELECTRON CHANNELING PATTERNS TO DETECT SUBSTRATE DAMAGE

FIELD OF THE INVENTION

The invention relates to semiconductor device assemblies, and more particularly to techniques for analyzing substrate associated with an integrated circuit.

BACKGROUND OF THE INVENTION

The semiconductor industry has recently experienced technological advances that have permitted dramatic increases in circuit density and complexity, and equally dramatic decreases in power consumption and package sizes. Present semiconductor technology now permits single-chip microprocessors with many millions of transistors operating at speeds of hundreds of millions of instructions per second to be packaged in relatively small, air-cooled semiconductor device packages. A by-product of such high-density and high functionality has been an increase in the number and complexity of the manufacturing processes.

As the manufacturing processes for semiconductor devices increase in difficulty, methods for analyzing the devices become increasingly important. A particular attribute of semiconductor devices that requires testing is the integrity of the device substrate, such as the substrate morphology, elemental or chemical composition, and crystallographic structure. During manufacture and processing, the crystalline structure of semiconductor device substrate often becomes damaged. When materials are implanted in the device during operations such as ion implantation, the ions strike the device substrate and lose their energy via electronic and nuclear collisions. If the transferred energy during a nuclear collision is high enough, the atoms are displaced from their lattice sites in the crystalline structure, damaging the substrate. The magnitude of the damage increases as the energy transferred during a collision increases. Damage can also occur during post-processing circuit usage; such damage includes, for example, CMOS latch-up events.

Damaged substrate results in reduced mobility in the damaged regions and defect levels in the band gap of the material, including deep-level traps for both electrons and holes, which have a tendency to capture free carriers from the conduction and valence bands. In addition to damaged crystalline structure, other abnormalities in the semiconductor devices may exist, for example, in the form of impurities in the substrate. If not repaired, the damaged regions may exhibit problems such as high resistivity.

As the semiconductor industry continues to demand increasingly complex and numerous manufacturing processes, the tendency for defects to occur within the substrate increases. Therefore, it would be helpful to have the ability to efficiently test structure within the semiconductor substrate to detect substrate damage.

SUMMARY OF THE INVENTION

The method and apparatus described herein involves determining a degree of substrate damage in an integrated circuit die. In an example embodiment, the back side of an integrated circuit die is thinned, and an examination region is exposed. The examination region is scanned with an electron beam, and backscattered electrons are detected in response. The detected backscattered electrons are used and an electron channeling pattern for the scanned region is provided. The electron channeling pattern is examined, and a degree of substrate damage is detected therefrom.

In another example embodiment, a system is configured and arranged to detect a degree of substrate damage in an integrated circuit die. A beam generator is constructed and arranged to thin the back side of the die and expose a region for examination. An electron beam scanner is constructed and arranged to scan the region with an electron beam and, in response, to detect backscattered electrons. The detected backscattered electrons are used by a processor configured and arranged to provide an electron channeling pattern for the scanned region. A computer arrangement is programmed to examine the electron channeling pattern and determine therefrom a degree of substrate damage.

The above summary is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description in connection with the accompanying drawings, in which.

Figure 1:
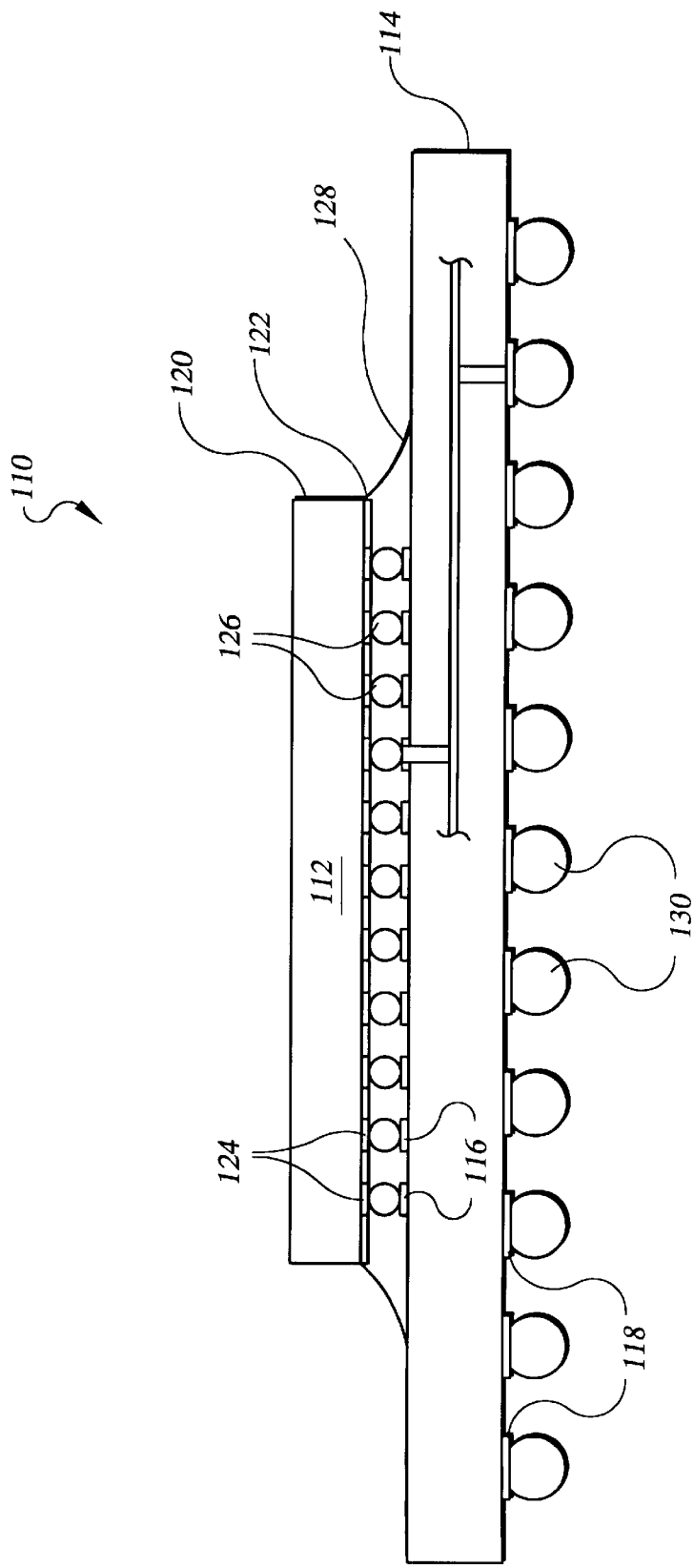
FIG. 1 shows a side view of a conventional integrated circuit packaged as a flip chip, consistent with the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the invention is to cover all modifications, equivalents, and alternatives falling within the spirit and scope of the invention as defined by the appended claims.

DETAILED DESCRIPTION

The present invention is believed to be applicable to a variety of different types of semiconductor devices, and the invention has been found to be particularly suited for flip-chip type circuit packages. While the present invention is not necessarily limited to flip-chip type circuit packages, an appreciation of various aspects of the invention is best gained through a discussion of various examples using this application.

According to an example embodiment, a system and method for detecting substrate damage in an integrated circuit die includes first thinning the back side of the die to expose an examination region. Such thinning may include at least one of: global thinning, local thinning, or a combination thereof. Devices typically used to perform thinning include a FIB device, a laser etching device, and a chemical-mechanical polishing (CMP) apparatus. The examination region is then scanned with an electron beam, and backscattered electrons emitted from the die in response to the electron beam are detected using, for instance, scanning electron microscopy (SEM). An electron channeling pattern is developed for the scanned region using the detected backscattered electrons. The pattern is examined and compared to a reference pattern to determine if the substrate is damaged.

In example applications, the substrate may include silicon, alloy material, devices, and circuitry in the die. The detection of substrate damage and/or the determination of the degree of damage may include activities such as looking for inconsistencies in the pattern, and comparing the channeling pattern to a reference channeling pattern from an undamaged device. Such comparing can be achieved by visual inspection or by computer-automated image contrasting. Examples of pattern inconsistencies include gray spots, holes and, in general, contrast areas. Using the channeling pattern to determine the degree of substrate damage provides an efficient and effective manner in which to analyze an integrated circuit.

As an example semiconductor device target for the present invention, FIG. 1 shows a side view 110 of a type of conventional flip-chip type die 112 assembled to a package substrate 114. Flip chip die 112 has a back side 120 and a circuit side in a portion of the die known as the epitaxial layer 122. The epitaxial layer 122 includes a number of circuit devices and has a thickness in the range of about one to fifteen microns. Bulk silicon fills the back side 120 and is referred to as the bulk silicon layer. A plurality of solder bumps 126 are made on the circuit side at pads 124. The solder bumps 126 are the inputs and outputs to the circuitry associated with the flip chip type die 112. The flip chip type die 112 is attached to the package substrate 114 via the solder bumps on the die 112. The package substrate 114 includes pads 116 that are arranged to correspond to the pattern of solder bumps 126 on the die 112. The region between the die 112 and package substrate 114 is filled with an under-fill material 128 that encapsulates the solder bump connections and provides additional mechanical benefits. The pads 116 are coupled via circuitry to pads 118 on the package substrate, and solder bumps 130 are formed on the pads 118. The solder bumps 130 are the inputs and outputs to the circuitry associated with the package substrate 114.

Electron backscattering occurs as a result of the application of an accelerated primary electron beam to a substrate such as in the flip chip die 112 shown in FIG. 1. The electrons striking the substrate cause various physical phenomena to occur, including the emission of low-energy secondary electrons (for example, about 0–50 eV), and higher-energy backscattered electrons having energies close to that of the primary beam electrons. Secondary electrons generally result from inelastic collisions between the primary beam electrons and inner shell electrons of atoms in the substrate. Backscattered electrons generally result from elastic collisions of high energy primary beam electrons with outer surface and subsurface atoms of the substrate. Due to the elastic nature of the collisions, the backscattered electrons maintain most of their incident energy. However, some of the backscattered primary beam electrons experience an energy loss characteristic of the atom collided with. The energy loss also varies with the depth into the substrate at which the collision occurred.

In connection with the present invention, it has been discovered that the diverse characteristics exhibited by electrons backscattered from dissimilar substances, elements located at different depths in the substrate, and imperfections in crystalline structure, can aid in analyzing the integrity of the substrate in an integrated circuit die. The quantity and energy level of backscattered electrons may be detected and compared. The energy level at which electrons are backscattered can be used to determine the atomic number of regions that the electrons are backscattered from. In addition, electrons backscatter at different energy levels from regions having the same composition but existing at different depths in the substrate, providing the ability to determine the location and thickness of regions in the substrate.

A particularly useful characteristic of the phenomena of backscattered electrons arises from the tendency of electrons to travel along "channels" in the interstices of the crystalline lattice structure in integrated circuit dies. Channels are crystal directions in the die along which electrons are "channeled" (or steered), and will not encounter any target nuclei. Directing an electron beam at the die results in electrons "channeling" down the interstices or "open channels" of the lattice. Backscattering occurs when the electrons encounter off-lattice-site atoms that intrude upon these channels. Such off-lattice-site atoms are associated with imperfections in the structure, such as amorphous or polycrystalline regions, and interstitial atoms. A reference channeling pattern can be developed for undamaged structures such as integrated circuit dies using devices like a scanning electron microscope (SEM). Once a reference pattern has been established for a particular type of die, patterns from test dies can be developed and compared to the reference pattern. Imperfections in the test die show up as an altered pattern.

In addition, the yield of backscattered electrons increases as the elements with which the electrons are colliding increase in atomic number. This characteristic is useful for detecting impurities or other structural composition differences within the substrate of the integrated circuit die.

Figure 2:
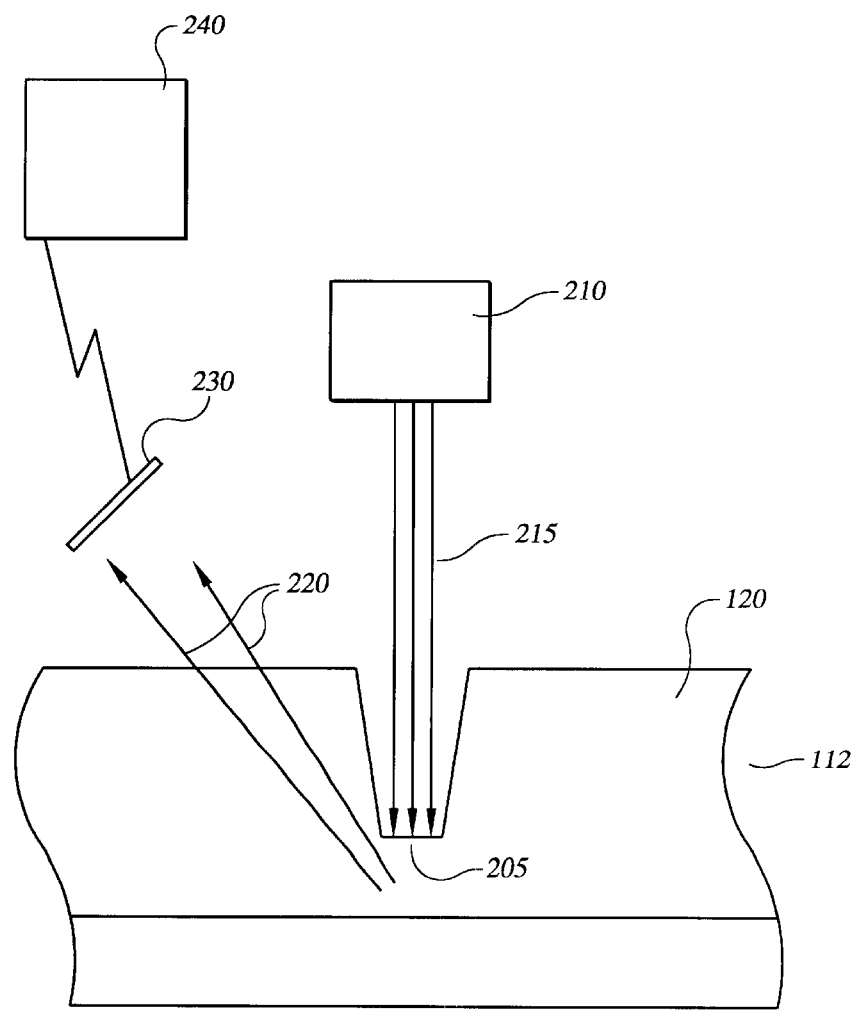
FIG. 2 shows a side view of an arrangement for testing an integrated circuit, according to an example embodiment of the present invention.

FIG. 2 shows an example system adapted to test a flip-chip die 112 for silicon substrate damage, according to an example embodiment of the present invention. The back side of the die 112 has been thinned, and a local examination region 205 is exposed. The local examination region may include, for instance, silicon or circuitry within the device. An electron-beam generating apparatus 210 is used to direct an electron beam 215 at the examination region 205. Backscattered electrons, depicted as directed segments 220, are emitted from the silicon substrate in the back side 120. The backscattered electrons 220 are detected by a detector 230. Using the detected backscattered electrons, an electron channeling pattern is created for the die 112 under test. The channeling pattern is examined and a degree of silicon-substrate damage is determined therefrom.

Depending on the desired sophistication of the system and method, detecting the degree of damage may be simply recognizing one or more significant anomalies in the channeling pattern, or may involve counting area units of pixel contrasts for sections of the image in which anomalies have been detected. In some applications, it is helpful to quantify these counted area units (for example, as the number of pixels) and to assign a "degree of damage" based on the count. If the count exceeds a first threshold, the integrated circuit die may be subjected to additional testing, for example, in a text chamber with various temperature and input/output conditions, and if the count exceeds a second (higher) threshold, the integrated circuit device is discarded.

Furthermore, either simple pattern recognition or the pixel contrast counting may be used to determine the type of substrate damage that is present in an integrated circuit device. For instance, reference channeling patterns or reference "counts" of area units of pixel contrasts may be created for devices exhibiting particular defects. Using these references, patterns or "counts" are generated for an integrated circuit die under test, compared to the reference, and the type of substrate damage present is determined.

In one example implementation, a computer arrangement 240 is communicatively coupled to the detector 230, and is configured and arranged to interpret the detected backscattered electrons and create such a channeling pattern. As discussed above, one example manner of "interpreting" is via the counting approach.

Figure 3:
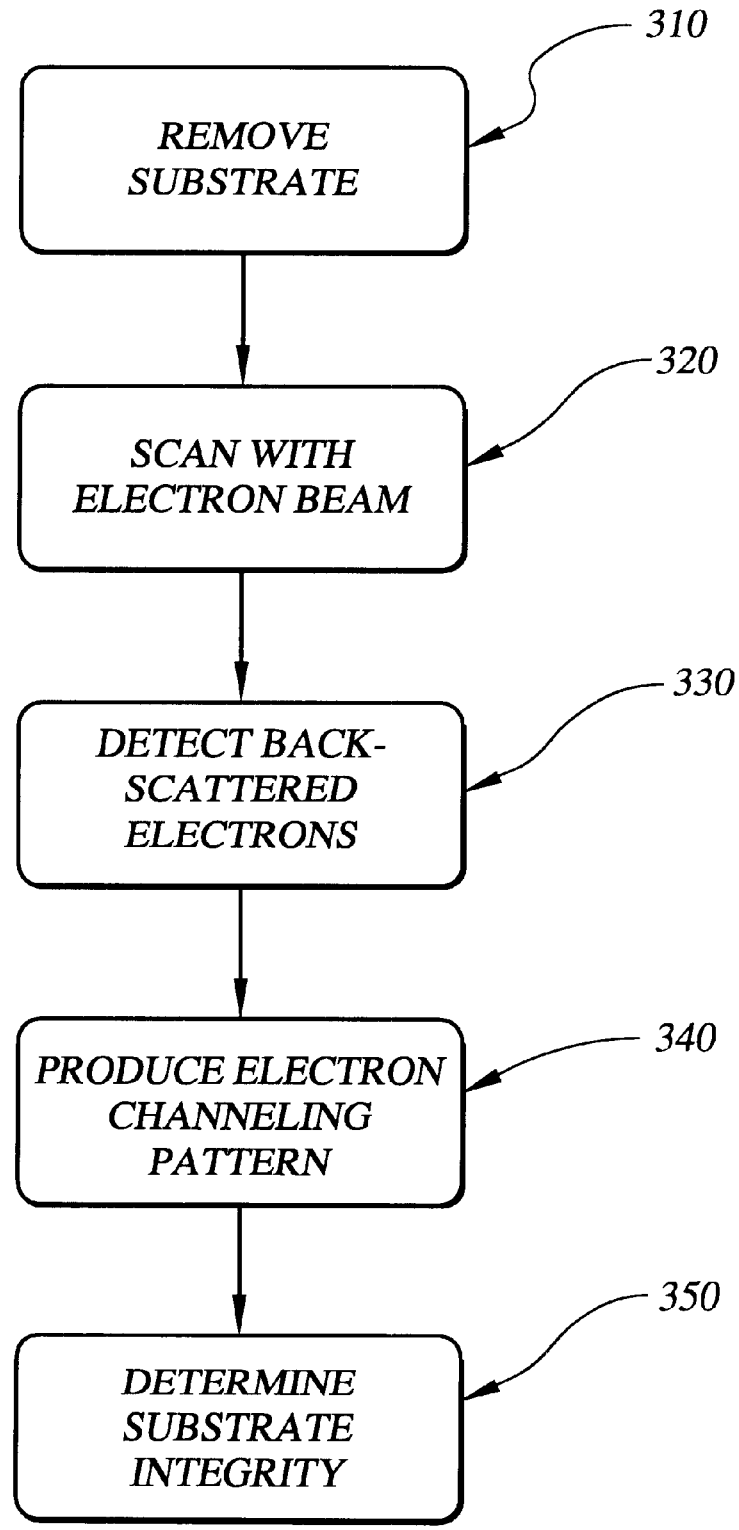
FIG. 3 is a flow diagram for a method for testing an integrated circuit, according to the present invention.

FIG. 3 is a flow diagram for a method of testing an integrated circuit die, according to a less-sophisticated example embodiment of the present invention. The flow begins at block 310 where substrate is removed and a test region is formed. An electron beam is used to scan the test region at block 320. At block 330, backscattered electrons are detected. An electron-channeling pattern is produced, as depicted at block 340. The integrity of the substrate is determined by visual comparison via the channeling pattern at block 350.

The present invention is amenable to various modifications and alternative forms that depart from the exact specifics shown by way of example in the drawings and the particular embodiments described above. The invention is to cover modifications, equivalents, and alternatives falling within the spirit and scope of the invention as defined by the appended claims.

What is claimed is:

1. A method for detecting substrate damage in an integrated circuit die having a back side and a circuit side, comprising:
    thinning the back side of the die and exposing a region for examination;
    scanning the region with an electron beam and, in response, detecting backscattered electrons;
    using the detected backscattered electrons and providing an electron channeling pattern for the scanned region; and
    examining the electron channeling pattern and determining therefrom substrate damage.

2. A method for detecting a degree of substrate damage in an integrated circuit die, according to claim 1, wherein examining the electron channeling pattern and determining therefrom substrate damage includes comparing the electron channeling pattern with a reference pattern.

3. A method for detecting substrate damage in an integrated circuit die, according to claim 2, wherein the die is in a flip chip package having the back side arranged opposite the circuit side.

4. A method for detecting substrate damage in an integrated circuit die, according to claim 3, wherein examining includes counting image units that manifest apparent anomalies.

5. A method for detecting substrate damage in an integrated circuit die, according to claim 4, wherein thinning the back side of the die includes exposing selected circuitry in the circuit side.

6. A method for detecting substrate damage in an integrated circuit die, according to claim 3, wherein the region includes the circuitry in the circuit side.

7. A method for detecting substrate damage in an integrated circuit die, according to claim 1, wherein thinning the back side of the die and exposing a region for examination include using a focused ion beam generator.

8. A method for detecting substrate damage in an integrated circuit die, according to claim 1, wherein the die is in a flip chip package, and wherein thinning the back side of the die includes exposing circuitry in the circuit side.

9. A method for detecting substrate damage in an integrated circuit die, according to claim 8, wherein examining the electron channeling pattern and determining therefrom substrate damage includes comparing the electron channeling pattern with a reference pattern.

10. A method for detecting substrate damage in an integrated circuit die, according to claim 1, wherein examining the electron channeling pattern and determining therefrom substrate damage includes using the electron channeling pattern to determine a type of alloy damage.

11. A method for detecting substrate damage in an integrated circuit die, according to claim 10, wherein determining a type of alloy damage includes determining a pattern anomaly including at least one of: gray spots, holes, and contrast areas.

12. A method for detecting substrate damage in an integrated circuit die, according to claim 1, wherein determining substrate damage includes determining a degree of damage to silicon substrate.

13. A method for detecting a degree of substrate damage in an integrated circuit die, according to claim 1, wherein determining a degree of substrate damage includes determining a quantified degree of damage to circuitry within the die.

14. A method for detecting substrate damage in an integrated circuit die, according to claim 1, wherein determining substrate damage includes determining a degree of damage to at least one device within the die.

15. A system for detecting substrate damage in an integrated circuit die, comprising:
    means for thinning the back side of the die and exposing a region for examination;
    means for scanning the region with an electron beam and, in response, detecting backscattered electrons;
    means for using the detected backscattered electrons to provide an electron channeling pattern for the scanned region; and
    means for examining the electron channeling pattern and determining therefrom substrate damage.

16. A system for detecting substrate damage in an integrated circuit die, comprising:
    a beam generator constructed and arranged to thin the back side of the die and expose a region for examination;
    an electron beam scanner constructed and arranged to scan the region with an electron beam and, in response, to detect backscattered electrons;
    a processor arrangement constructed to use the detected backscattered electrons to provide an electron channeling pattern for the scanned region; and
    a computer arrangement, including a computer, programmed to examine the electron channeling pattern and to determine therefrom substrate damage.

17. A system for detecting substrate damage in an integrated circuit die, according to claim 16, wherein the computer is further programmed to examine the electron channeling pattern and determine therefrom a type of alloy damage.

18. A system for detecting substrate damage in an integrated circuit die, according to claim 17, wherein the computer is further programmed to examine the electron channeling pattern and determine therefrom a pattern anomaly including at least one of: gray spots, holes, and contrast areas.

19. A system for detecting substrate damage in an integrated circuit die, according to claim 16, wherein the electron beam scanner includes a scanning electron microscope.

20. A system for detecting substrate damage in an integrated circuit die, according to claim 16, wherein the computer is further programmed to examine the electron channeling pattern and determine therefrom a quantified degree of substrate damage using an image comparison process.

* * * * *